United States Patent
Leigh et al.

(10) Patent No.: US 10,588,234 B2
(45) Date of Patent: Mar. 10, 2020

(54) SEMICONDUCTOR ASSEMBLY

(71) Applicant: Hewlett Packard Enterprise Development LP, Houston, TX (US)

(72) Inventors: Kevin B. Leigh, Houston, TX (US); George D. Megason, Spring, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/073,008

(22) PCT Filed: Jan. 26, 2016

(86) PCT No.: PCT/US2016/014927
§ 371 (c)(1),
(2) Date: Jul. 26, 2018

(87) PCT Pub. No.: WO2017/131638
PCT Pub. Date: Aug. 3, 2017

(65) Prior Publication Data
US 2019/0045650 A1 Feb. 7, 2019

(51) Int. Cl.
*H01R 12/00* (2006.01)
*H05K 7/10* (2006.01)
*H05K 7/20* (2006.01)
*H01L 23/32* (2006.01)
*H01R 12/71* (2011.01)

(52) U.S. Cl.
CPC ........... *H05K 7/1061* (2013.01); *H01L 23/32* (2013.01); *H01R 12/716* (2013.01); *H05K 7/20* (2013.01)

(58) Field of Classification Search
CPC ......... H05K 7/1061; H05K 7/20; H01L 23/32

USPC ........................................................ 439/55
See application file for complete search history.

(56) References Cited

U.S. PATENT DOCUMENTS

| | | | |
|---|---|---|---|
| 5,407,361 A | 4/1995 | Ikeya | |
| 5,727,955 A | 3/1998 | Tsubakihara | |
| 5,880,930 A * | 3/1999 | Wheaton | H05K 7/20409 165/80.3 |
| 6,086,387 A | 7/2000 | Gallagher | |
| 6,128,190 A * | 10/2000 | Hardin | H01L 23/32 165/80.2 |
| 6,135,793 A * | 10/2000 | Babineau | H01R 13/65802 361/753 |
| 6,242,690 B1 * | 6/2001 | Glover | H05K 9/0037 174/367 |
| 6,278,610 B1 | 8/2001 | Yasufuku et al. | |
| 6,607,394 B2 * | 8/2003 | Lindberg | G06F 1/183 439/324 |
| 6,932,618 B1 | 8/2005 | Nelson | |
| 6,992,889 B1 * | 1/2006 | Kashiwagi | H01L 23/3675 165/104.33 |

(Continued)

FOREIGN PATENT DOCUMENTS

JP 2012119362 6/2012

*Primary Examiner* — Abdullah A Riyami
*Assistant Examiner* — Vladimir Imas
(74) *Attorney, Agent, or Firm* — Hewlett Packard Enterprise Patent Department (57) ABSTRACT

An example semiconductor assembly can include a hingeably-coupled component that receives a semiconductor board. In some examples, the component can be hingeably rotated to an open position to receive the semiconductor board. In some examples, the component can be hingeably detached from the assembly to receive the semiconductor board.

14 Claims, 6 Drawing Sheets

(56) References Cited

U.S. PATENT DOCUMENTS

| | | | |
|---|---|---|---|
| 7,003,230 B2* | 2/2006 | Branch | H05K 7/1428 |
| | | | 361/704 |
| 7,108,517 B2 | 9/2006 | Harper | |
| 7,273,399 B2* | 9/2007 | LeGrow | H01R 12/716 |
| | | | 439/620.2 |
| 7,275,937 B2* | 10/2007 | Ellison | G02B 6/4201 |
| | | | 439/67 |
| 7,708,565 B2* | 5/2010 | Guja | G02B 6/4201 |
| | | | 439/327 |
| 7,724,530 B2 | 5/2010 | Clayton | |
| 7,922,523 B2* | 4/2011 | Demuynck | H01L 23/32 |
| | | | 439/541.5 |
| 7,946,856 B2* | 5/2011 | Jaeger | H01R 12/714 |
| | | | 439/66 |
| 9,591,785 B1* | 3/2017 | Nagarajan | H05K 5/00 |
| 9,910,459 B2* | 3/2018 | North | G06F 1/1656 |
| 2002/0024025 A1 | 2/2002 | Watanabe | |
| 2005/0157452 A1* | 7/2005 | Ohmi | H05K 7/20336 |
| | | | 361/676 |
| 2007/0068654 A1* | 3/2007 | Chang | F28D 15/0233 |
| | | | 165/104.21 |
| 2009/0103855 A1 | 4/2009 | Binkert et al. | |
| 2013/0052847 A1 | 2/2013 | Figuerado et al. | |

* cited by examiner

SEMICONDUCTOR ASSEMBLY

BACKGROUND

Computing devices (e.g., semiconductor boards and system boards) can be coupled using a number of optical and electrical components. The number of electrical components and optical components can electrically and optically couple the semiconductor board to a system board. The semiconductor board can also include a semiconductor chip, and a heat sink can be used with the semiconductor chip to allow a cooling of the semiconductor chip.

DETAILED DESCRIPTION

A semiconductor assembly can integrate optical components and other electrical components in a single package. The semiconductor assembly can receive a semiconductor board (e.g., mezzanine-style multi-chip module) that includes a semiconductor chip, optical components, and electrical components. The semiconductor board separates a cooling zone for thermal-sensitive devices (e.g., optical components) from that of high-powered devices (e.g., Application Specific Integrated Circuit, ASIC). The semiconductor assembly can include a component hingeably coupled (e.g., attached, connected, etc.) to a system board or other component coupled to the system board. The hingeably-coupled component can receive the semiconductor board.

In some approaches, an optical-electronic assembly may present difficulties when installing a number of optical cables to each corresponding optical component (e.g., optical transceivers). For example, a number of types of optical components (e.g., optical transceivers using single-mode fibers) blindmated to the semiconductor board may not be suitable to mate with the number of optical cables because of tight opto-mechanical tolerance requirements. Blindmating can refer to a mating action that occurs via a sliding and/or snapping action which self-aligns and allows for a small misalignment when mating. Mating can refer to a method of assembling two or more component parts with mutually complementary shapes together. Further, additional alignment features extruding from the bottom of the assembly to hold the optical components can reduce space available for other components.

The semiconductor assembly as described herein can provide the hingeably-coupled component for use of the optical components that have tight opto-mechanical tolerances. The hingeably-coupled component can enable the semiconductor board to be mated with and unmated from the system board, and the component can provide installment of a number of optical cables to each corresponding optical component (e.g., optical transceivers using single-mode fibers) on the semiconductor board while the semiconductor board is unmated from the system board. The hingeably-coupled component mated with the semiconductor board can be hingeably rotated to the closed position or coupled to the assembly. For example, the semiconductor board can be received while the component is in the open position and the semiconductor board can be mated with the system board while the system board is in the closed position. In some examples, the component can be hingeably detached from the system board to receive the semiconductor board, and be hingeably coupled to the system board to mate the semiconductor board with the system board.

Figure 1A:
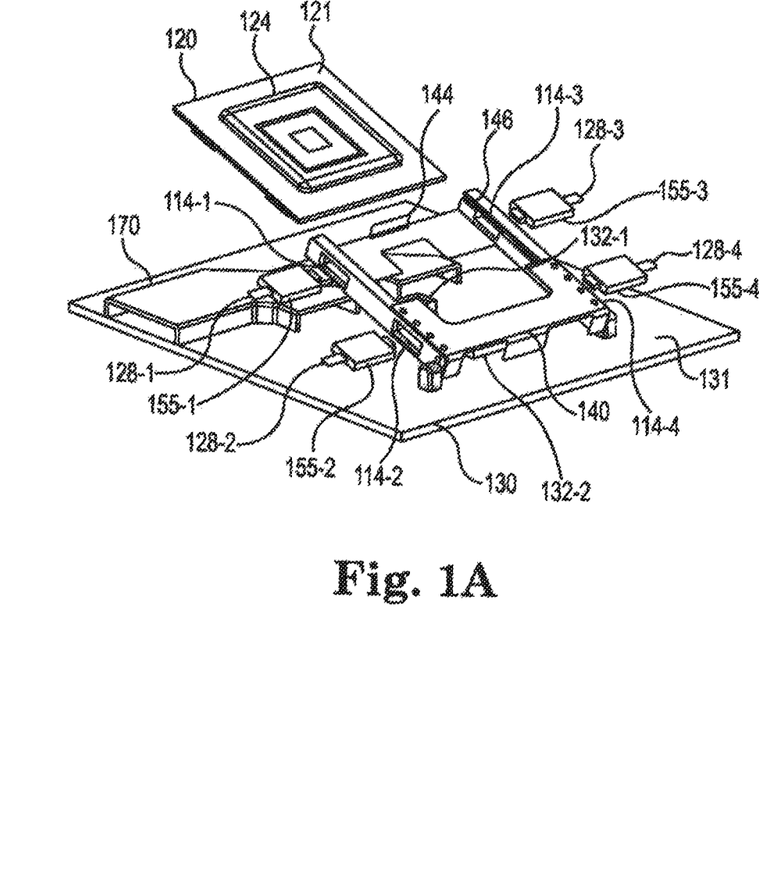
FIGS. 1A, 1B, 1C each illustrate an example of a semiconductor assembly according to the present disclosure.
Figure 1B:
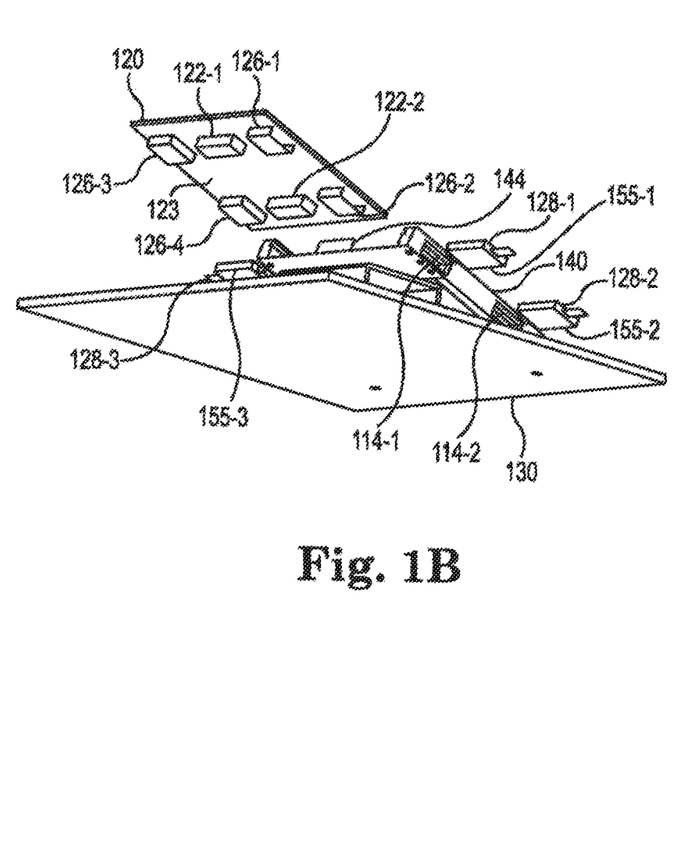
Figure 2A:
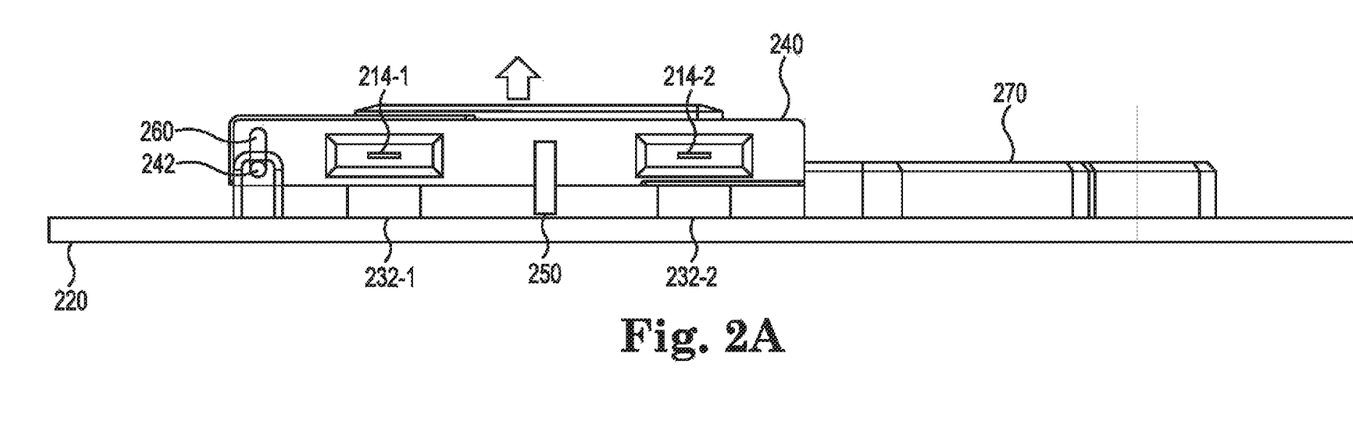
FIGS. 2A, and 2B illustrate an example of a semiconductor assembly according to the present disclosure.
Figure 2B:
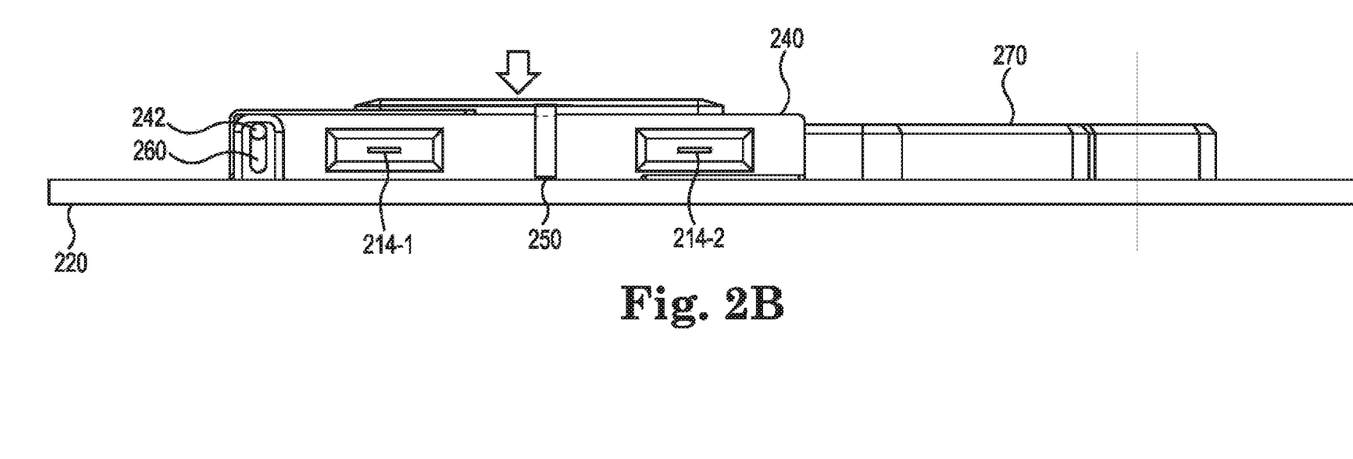

FIGS. 1A and 1B each illustrate a "one-part" design, an example of a semiconductor assembly according to the present disclosure. FIG. 1A is a first perspective view of the semiconductor assembly while FIG. 2B is a second perspective view of the same semiconductor assembly. In a number of examples, a socket component 140 can be hingeably coupled to a system board 130 and can receive a semiconductor board 120 while the socket component 140 is in an open position (e.g., a position of the socket component 140 when rotated to receive the semiconductor board 120 while the semiconductor board 120 is unmated from the system board 130, as illustrated in FIGS. 1A and 1B). After receiving (e.g., inserting a semiconductor board 120 into the socket component 140) the semiconductor board 120, the socket component 140 can be rotated to a closed position (e.g., a position of the socket component 140 when rotated to mate the semiconductor board 120 to the system board 130, as illustrated in FIGS. 2A-2B) to mate with a system board 130. The size, length, and/or width of the assembly is not limited to the illustrated example. That is, the assembly can include additional space, components, slots, etc. not illustrated in FIGS. 1A and 1B.

The semiconductor board (e.g., mezzanine-style multi-chip module) 120 can include a semiconductor chip 124 (e.g., ASIC), a number of optical connectors 126-1, 126-2, 126-3, 126-4, and a number of electrical connectors 122-1, 122-2 as illustrated in FIGS. 1A and 1B. Each optical connector 126-1, 126-2, 126-3, 126-4 can optically connect the semiconductor board 120 to other semiconductor boards (not shown) through the number of optical cables 128-1, 128-2, 128-3, 128-4. Each electrical connector 122-1, 122-2 is for electrically connecting the semiconductor board 120 to the system board 130. The semiconductor chip 124 can be coupled to a surface 121 of the semiconductor board 120, as illustrated in FIG. 1A. Although examples are not limited to a particular type of semiconductor chip, the semiconductor chip 124 can be a network switch ASIC chip.

The number of optical transceivers (not shown) can be encased within each corresponding optical connector 126-1, 126-2, 126-3, 126-4. Each optical connector 126-1, 126-2, 126-3, 126-4 can be coupled to a surface 123 of the semiconductor board 120, for example, as illustrated in FIG. 1B. Further, for example, each optical connector 126-1, 126-2, 126-3, 126-4 can be located at each corner of a semiconductor board 120 as illustrated in FIG. 1B. However, examples are not so limited.

The socket component 140 can be designed to receive the number of optical cables 128-1, 128-2, 128-3, 128-4 through a number of corresponding optical cable connectors 155-1, 155-2, 155-3, 155-4, wherein each optical cable connector 155-1, 155-2, 155-3, 155-4 is coupled to an end of each corresponding optical cable 128-1, 128-2, 128-3, 128-4. In a number of examples, the socket component 140 can include a number of slots 114-1, 114-2, 114-3 (illustrated in FIG. 1A), and 114-4 (not visible). Though not explicitly shown in FIG. 1A, 114-4 indicates a slot located on a side where the slot 114-3 is also located. The slot 114-4 can be in parallel with the slot 114-2. The number of slots 114-1, 114-2, 114-3, 114-4 can each enable a cable (e.g., optical cables) to mate with an optical connector (e.g., optical connector 126-1, 126-2, 126-3, 126-4). For example, each slot 114-1, 114-2, 114-3, 114-4 can enable each corresponding optical cable 128-1, 128-2, 128-3, 128-4 and each corresponding optical cable connector 155-1, 155-2, 155-3, 155-4 to pass through each side of a socket component 140 to mate with each corresponding optical connector 126-1, 126-2, 126-3, 126-4 coupled to the semiconductor board 120, as illustrated in FIG. 1B. Each optical connector 126-1, 126-2, 126-3, 126-4 can be located corresponding to each corresponding slot 114-1, 114-2, 114-3, 114-4 of the socket component 140 such that a number of optical cables 155-1, 155-2, 155-3, 155-4 mates with each corresponding optical connector through each corresponding slot 114-1, 114-2, 114-3, 114-4 after the semiconductor board 120 mates with the socket component 140.

The number of electrical connectors 122-1, 122-2 can be coupled to the surface 123 of the semiconductor board 120, as illustrated in FIG. 1B. Further, each electrical connector 122-1, 122-2 can be located between two optical connectors (e.g., between optical connectors 126-1 and 126-3) coupled to the semiconductor board as illustrated in FIG. 1B. However, examples are not so limited.

Figure 1C:
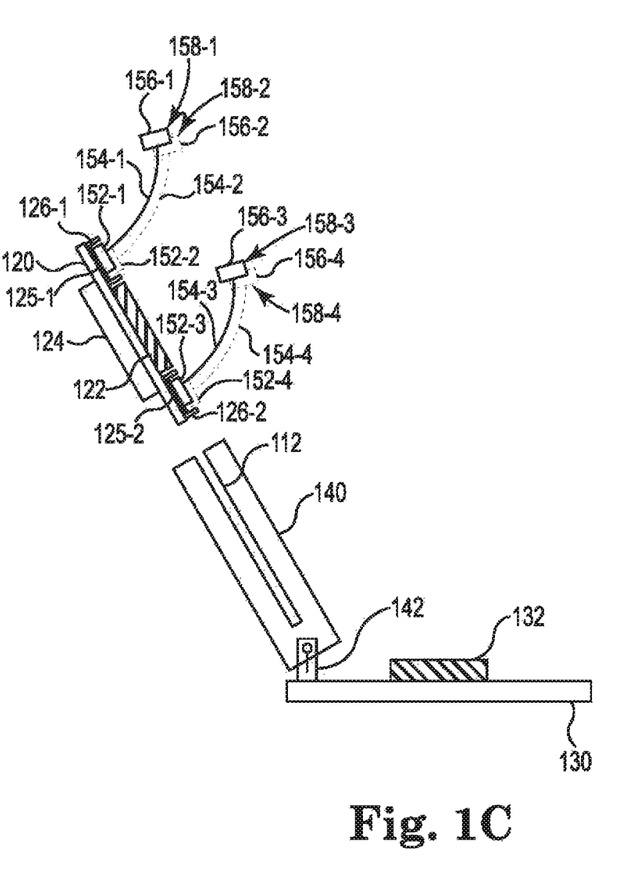

As illustrated in FIG. 1C, as another example, the socket component 140 can include an aperture 112 on each side of the socket component 140, as a cable management feature, to receive the semiconductor board 120 after the semiconductor board 120 being mated with a number of optical cable assembly 158-1, 158-2, 158-3, 158-4. Each optical cable assembly can includes two optical cable connectors (e.g., optical cable connectors 152-1 and 156-1) and an optical cable (e.g., 154-1), wherein each optical cable connector (e.g., optical connectors 152-1 and 156-1) is coupled to each end of the optical cable (e.g., 154-1), as illustrated in FIG. 1C. For example, each optical cable connector 152-1, 152-2, 152-3, 152-4 can mate with each corresponding optical connector 126-1, 126-2, 126-3, 126-4 of each corresponding optical transceiver 125-1, 125-2, 125-3, 125-4 of the semiconductor board 120. Upon mating the semiconductor board 120 with the number of optical cable assembly 158-1, 158-2, 158-3, 158-4, the number of optical cable connectors 156-1, 156-2, 156-3, 156-4 and optical cables 154-1, 154-2, 154-3, 154-4 can be slid into the socket component 140 through the aperture 112 when the socket component 140 is being mated with the semiconductor board 120.

In some examples, a number of additional optical cable connectors (not shown) with a number of additional optical cables (not shown) connected to each corresponding additional optical cable connectors can mate with each corresponding optical cable connector 156-1, 156-2, 156-3, 156-4 at any particular time. For example, because the aperture 112 can receive the semiconductor board 120 with the second set of optical cable connectors 156-1, 156-2, 156-3, 156-4 coupled to each corresponding optical connector 126-1, 126-2, 126-3, 126-4, the number of additional optical cable connectors can mate with each corresponding optical cable connector 156-1, 156-2, 156-3, 156-4 of each corresponding optical assembly 158-1, 158-2, 158-3, 158-4 before and/or after the semiconductor board 120 mates with the socket component 140.

The system board can include a number of electrical connectors 132-1, 132-2. The number of electrical connectors 132-1, 132-2 can be coupled to a surface 131 of the system board 130. Locations of the number of electrical connector 132-1, 132-2 on the system board 130 can correspond to locations of the number of electrical connectors (e.g., electrical connectors 122-1, 122-2 in FIG. 1B) on the semiconductor board 120. For example, the number of electrical connectors 132-1, 132-2 can be located on the surface 131 of the system board 130 such that each electrical connector 132-1, 132-2 on the system board 130 can mate with each corresponding electrical connector (e.g., electrical connectors 122-1, 122-2) coupled to the semiconductor board 120 when the semiconductor board 120 that is inserted into the socket component 140 mates with the system board 130 through the number of electrical connectors 122-1, 122-2 in FIG. 1B and electrical connectors 132-1, 132-2 coupled to the semiconductor board 120 and a system board 130.

The socket component 140 can include a retainer tab 144 to lock (e.g., hold in place, fix in place, etc.) the semiconductor board 120 to the socket component 140 as illustrated in FIG. 1A. For example, the retainer tab 144 can be a tab of rectangular shape located in the middle of a side of the socket component 140, as illustrated in FIGS. 1A and 1B, where it first receives the semiconductor board 120. For example, when the semiconductor board 120 mates with the socket component 140, the retainer tab 144 of the socket component 140 can lock the semiconductor board 120 to the socket component 140 to prevent the socket component 140 from separating from the semiconductor board 120. The assembly can also include an air duct component 170, as illustrated in FIG. 1A. The air duct component 170 enables air to flow into and out of the interior of the socket component 140. As illustrated in FIG. 1A, the socket component 140 can have an open area where the retainer tab 144 is located to allow air flow out of the socket component 140 when the socket component 140 mates with the air duct component 170.

As illustrated in FIGS. 1A and 1B, the socket component 140 can receive the semiconductor board 120 while the socket component 140 is in an open position. The socket component 140 can include a rail system 146 through which the semiconductor board 120 can be inserted. The semiconductor board 120 can be inserted by sliding it into the socket component 140. Examples of how the socket component (e.g., socket component 140) is being mated with the semiconductor board 120 and locked to the system board 130 will be further illustrated in FIGS. 2A and 2B.

FIGS. 2A and 2B each illustrate an example of a semiconductor assembly according to the present disclosure. FIGS. 2A and 2B each show a side view of the assembly that is analogous to the one-part design illustrated in FIGS. 1A-1C.

A socket component 240 can be hingeably coupled to the system board 220 via a number of hinges (e.g., a hinge 242 and an additional hinge not illustrated). For example, the socket component 240 can include a hinge 242 (and another hinge on the opposite side, not illustrated) coupled to the system board 230. In a number of examples, each hinge (e.g., a hinge 242) can include a vertical slot (e.g., a vertical slot 260) as illustrated in FIGS. 2A-2B. The socket component 240 can move vertically on the vertical slots (e.g., such as vertical slot 260) before being rotated to an open position or after being rotated to a closed position. For example, as illustrated in FIG. 2A, the socket component 240, before being rotated to the open position, can be lifted vertically upward via vertical slots to unmate the semiconductor board (not shown) from the system board 230. In another example, as illustrated in FIG. 2B, the socket component 240, after being rotated to the closed position, can be pushed vertically down to mate the semiconductor board 240 with the system board 230.

Using vertical slots (e.g., a vertical slot 260) on the number of hinges (e.g., a hinge 242), the socket component 240 can be lifted vertically as illustrated in FIG. 2A. After being lifted, the socket component 240 can be rotated to the open position, as illustrated in FIGS. 1A, 1B, and 1C, to receive the semiconductor board 220. After mating the semiconductor board 220 with the socket component 240, the socket component 240 can be rotated again to the closed position. The socket component 240 then can be pushed vertically down to mate the semiconductor board 220 with the system board 230 as illustrated in FIG. 2B. For example, when the socket component 240 is pushed vertically down, a number of electrical connectors 232-1 and 232-2 on the system board 220 mates with each corresponding electrical connector (not shown) on the semiconductor board (not shown).

The socket component can include a number of locking components, such as locking component 250, along with a number of locking components not illustrated in FIGS. 2A and 2B. The number of locking components can be located on and coupled to the surface 131 (as shown in FIG. 1A) of the system board 230 such that each of the number of locking components (e.g., locking component 250) aligns with each side of the socket component 240 when the socket component is rotated to a closed position. As illustrated in FIG. 2B, the socket component 240 can be locked through the number of locking components (e.g., locking component 250) when the socket component 240 is pushed vertically down to mate the semiconductor board 120 to the system board 230.

Figure 3A:
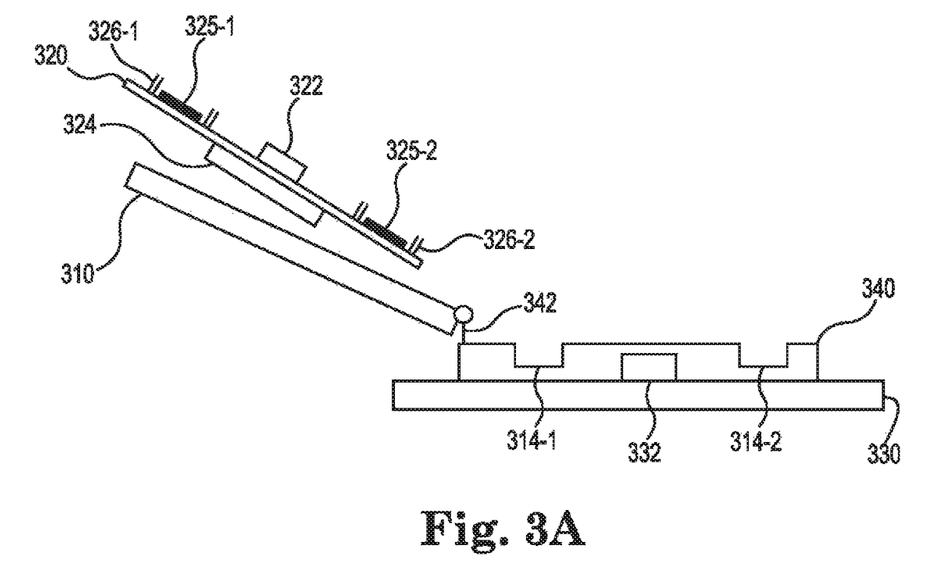
FIGS. 3A, 3B, 3C, and 3D illustrate an example of a semiconductor assembly according to the present disclosure.

FIGS. 3A-3D each illustrate a "two-part" design, an example of a semiconductor assembly according to the present disclosure. In a number of examples, a carrier 310 can be hingeably coupled to a socket component 340 and can receive a semiconductor board 320 while the carrier 310 is in an open position, as illustrated in FIG. 3A. After mating with the semiconductor board 320, the carrier 310 can be rotated to a closed position to mate the semiconductor board 320 with the system board 330. The size, length, and/or width of the assembly is not limited to the illustrated example. That is, the assembly can include additional space, components, slots, etc. not illustrated in FIGS. 3A, 3B, 3C, and 3D.

FIG. 3A illustrates the semiconductor assembly wherein the carrier 310 is in the open position to receive the semiconductor board 320. The carrier 310 can be hingeably coupled to the socket component 340 such that the carrier 310 can be rotated to the open position as illustrated in FIG. 3A. When the carrier 310 is in the open position, the carrier 310 can receive the semiconductor board 320. When mating with the carrier 310, a surface (e.g., a surface 121 as illustrated in FIG. 1A) of the semiconductor board 320 on which a semiconductor chip 324 is placed can be in contact with the carrier 310 as illustrated in FIG. 3A. Though not illustrated in FIG. 3A, the carrier 310 can have an aperture through which, when the semiconductor board 320 mates with the carrier 310, the semiconductor chip 324 on the semiconductor board 320 extrudes through the carrier 310 to be in contact with a heat sink 380 as illustrated in FIG. 3D.

Figure 3B:
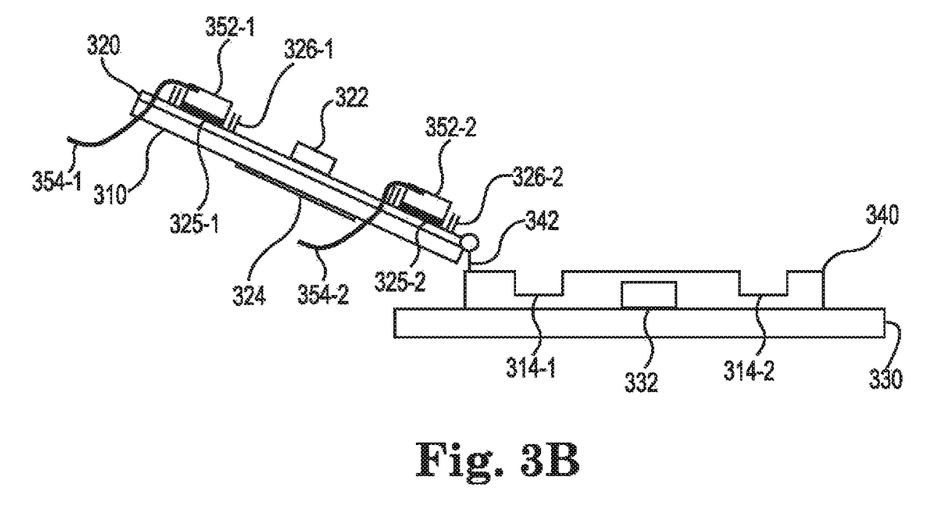
Figure 3C:
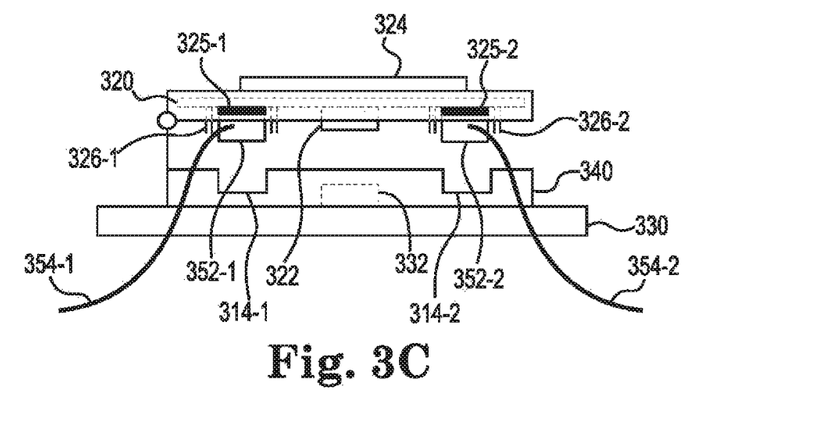
Figure 3D:
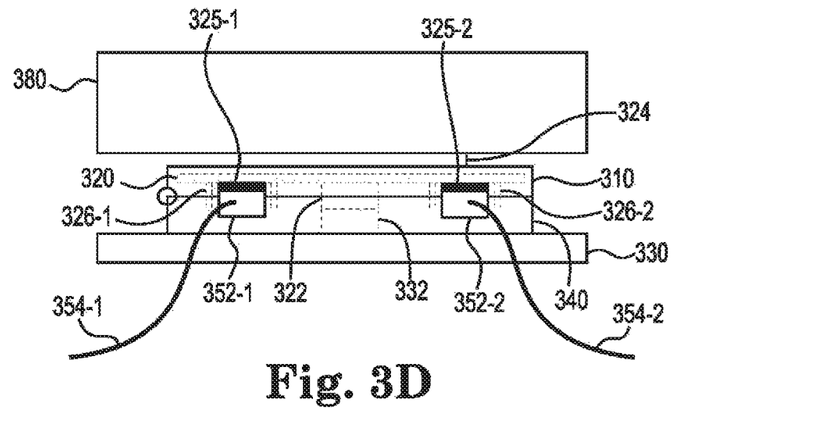

As illustrated in FIG. 3B, upon rotating the carrier 310 to the open position, a number of optical cables (e.g., optical cables 354-1, 354-2) can be installed on each corresponding optical connector (e.g., optical connectors 326-1, 326-2) through each corresponding optical cable connector (e.g., 352-1, 352-2) coupled to the end of each optical cable (354-1, 354-2) as illustrated in FIG. 3B-3D, wherein each optical cable connector (e.g., 352-1, 352-2) couples to each corresponding optical transceivers (e.g., optical transceivers 325-1, 325-2) encased within each corresponding optical connectors (e.g., optical connectors 326-1, 326-2) and coupled to the surface 123 (as shown and illustrated in FIG. 1B) of the semiconductor board 320.

As illustrated in FIG. 3C, upon installing the number of optical cables (e.g., optical cables 354-1, 354-2), the carrier 310 has been rotated to the closed position to mate the semiconductor board 320 with the system board 330. The carrier 310 hingeably coupled to the socket component 340 can be rotated to the closed position before mating the semiconductor board 320 with the system board 330. The socket component 340 can have a number of slots (e.g., slots 314-1, 314-2) through which each corresponding optical cable connector (e.g., optical cable connectors 352-1, 352-2) coupled to each corresponding optical cable (e.g., optical cables 354-1, 354-2) can extend out of the socket component 340. Unlike the number of slots illustrated in FIGS. 1A-1B or 2A-2B, the number of slots can be formed as cutouts in the walls of the socket component 340, as illustrated in FIG. 3A. Such design of the number of slots allows the optical cables (e.g., 354-1, 354-2) to mate with the optical connectors (e.g., optical connectors 326-1, 326-2) before the carrier 310 can be pushed vertically down, as illustrated in FIG. 3D.

As illustrated in FIG. 3D, upon rotating the carrier 310 to the close position, the carrier 310 can be pushed vertically down to mate the semiconductor board 320 with the system board 330. For example, as illustrated in FIG. 3D, an electrical connector 332 on system board 330 mates with an electrical connector 322 on semiconductor board 320 when the carrier is pushed vertically down. The electrical connector 332 on the system board 330 can be located corresponding to a location of the electrical connector 322 on the semiconductor board 320. For example, the electrical connector 332 can be located such that the electrical connector 332 mates with the electrical connector 322 without further aligning the electrical connector 332 or 322 when the carrier 310 is pushed vertically down.

Though not illustrated in FIG. 3D, the assembly can have a locking system to lock the carrier 310 to the socket component 340 when the semiconductor board 320 mates with the system board 330 as illustrated in FIG. 3D. After mating the semiconductor board 320 with the system board 330, a heat sink 380 can be installed on top of the semiconductor chip 324 as illustrated in FIG. 3D to allow cooling of the semiconductor chip 324.

Figure 4:
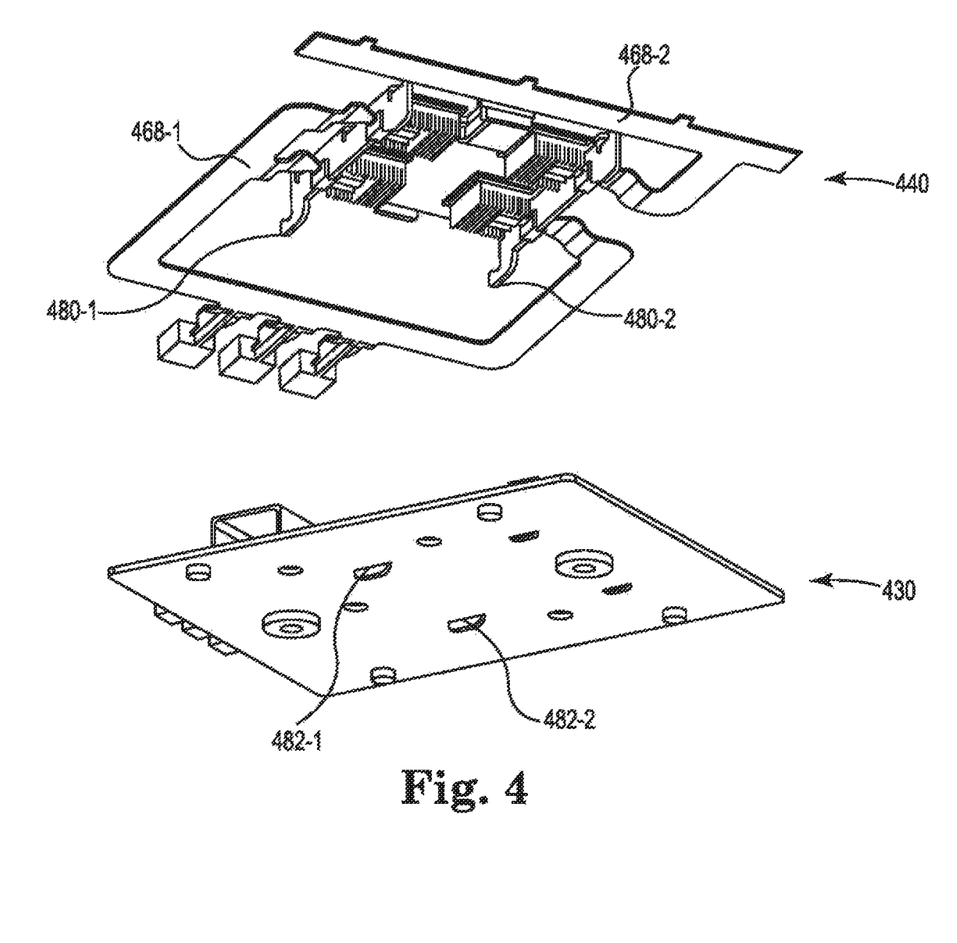
FIG. 4 illustrates an example of a semiconductor assembly according to the present disclosure.

FIG. 4 illustrates an example of a semiconductor assembly according to the present disclosure. An upper part of FIG. 4 illustrates a bottom perspective of socket component 440 to which a number of optical waveguides are coupled, and a lower part of FIG. 4 illustrates a bottom perspective view of a system board 430 with the socket component 440 mated. The illustrated assembly can be analogous to that of FIGS. 1A-1C except that a socket component 440 of FIG. 4 can be designed to be hingeably coupled to and detached from a system board 430. For example, the socket component 440 can include a number of slot hinges 480-1, 480-2 as illustrated in FIG. 4. The number of slot hinges 480-1, 480-2 can mate with each corresponding board slot 482-1, 482-2 on the system board 430. Each board slot 482-1, 482-2 can have a sleeve (not shown) to more easily and reliably mate with each corresponding slot hinges 480-1, 480-2. A number of optical cables (e.g., optical cables 128-1, 128-2, 128-3, 128-4 illustrated in FIGS. 1A-1B) and a semiconductor board (e.g., a semiconductor board 320 illustrated in FIG. 4) can mate with the detached socket component 440. The socket component 440 mated with the number of optical cables and the semiconductor board can then be mated with the system board 430 using the number of slot hinges 480-1, 480-2.

As illustrated in FIG. 4, the semiconductor assembly can include a number of optical waveguide assemblies (e.g., optical waveguide assembly 468-1, 468-2 as illustrated in FIG. 4) within which a number of optical cables (e.g., optical cables 128-1, 128-2, 128-3, 128-4 as illustrated in FIG. 1A-1C) are encased. For example, as illustrated in FIG. 4, a number of optical waveguide assemblies can be coupled to each corresponding slot (e.g., slots 114-1, 114-2, 114-3, 114-4) of the socket component 440 to align optical cables (e.g., optical cables 128-1, 128-2, 128-3, 128-4) within each corresponding optical waveguide assembly 468-1, 468-2. Although two optical waveguide assemblies 468-1, 468-2 are illustrated in FIG. 4, the semiconductor assembly as described herein is not limited to a particular number of optical waveguide assemblies.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A semiconductor assembly, comprising:
    a carrier, to receive a semiconductor board, wherein a plurality of optical transceivers are coupled to a surface of the semiconductor board, the carrier comprising an aperture configured to enable a semiconductor chip disposed on the semiconductor board to extrude through the aperture of the carrier;
    a socket component hingeably coupled to the carrier and coupled to a system board; and
    the system board.

2. The semiconductor assembly of claim 1, wherein each of the plurality of optical transceivers coupled to the semiconductor board is encased within an optical connector to manually mate a plurality of optical cables to each corresponding optical connector.

3. The semiconductor assembly of claim 1, wherein each of a plurality of hinges coupled to the carrier includes a vertical slot to allow the carrier to move vertically on the vertical slots.

4. The semiconductor assembly of claim 1, wherein the semiconductor board includes:
    a semiconductor chip coupled to a first surface of the semiconductor board;
    a first plurality of electrical connectors coupled to a second surface of the semiconductor board, wherein a second plurality of electrical connectors coupled to the system board mates with each of the corresponding first plurality of electrical connectors to electrically connect the semiconductor board to the system board.

5. The semiconductor assembly of claim 4, wherein the assembly includes a locking system to lock the carrier to the socket component when the semiconductor board is mated with the system board.

6. A semiconductor assembly, comprising:
    a socket component hingeably coupled to a system board and to receive a semiconductor board, the socket component further comprising an aperture configured to receive the semiconductor board after a plurality of optical cable connectors are coupled to a corresponding plurality of optical connectors on the semiconductor board;
    the semiconductor board having a first surface and a second surface opposite to the first surface, wherein:
        a semiconductor chip is coupled to the first surface; and
        a plurality of optical transceivers coupled to the second surface of the semiconductor board to electrically connect the semiconductor board to the system board; and
    the system board.

7. The semiconductor assembly of claim 6, wherein a plurality of hinges coupled to the socket component includes a vertical slot to allow the socket component to move vertically on the vertical slots.

8. The semiconductor assembly of claim 6, wherein the socket component includes:
    a cable management feature to allow mating a plurality of optical cables with each corresponding optical connector board before the socket component receives the semiconductor board; and
    a rail system to insert the semiconductor board by sliding into the socket component through the rail system.

9. The semiconductor assembly of claim 6, wherein the semiconductor board comprises a plurality of electrical connectors coupled to the second surface of the semiconductor board, wherein the plurality of electrical connectors to mate with each of the corresponding electrical connector to electrically connect the semiconductor board to the system board.

10. The semiconductor assembly of claim 9, wherein each of the plurality of optical transceivers is encased within an optical connector to manually mate a plurality of optical cables to each of the corresponding optical connector, wherein the socket component includes a plurality of slots to mate a plurality of optical cables with each corresponding optical connector when the socket component receives the semiconductor board.

11. The semiconductor assembly of claim 10, wherein the assembly includes a locking system to lock the socket component to the system board when mated.

12. The semiconductor assembly of claim 1, further comprising a heat sink, and wherein the semiconductor chip is in contact with the heat sink through the aperture when the carrier is in a closed position.

13. The semiconductor assembly of claim 3, wherein the vertical slots further enable the carrier to be rotated into an open position or a closed position.

14. The semiconductor assembly of claim 7, wherein the vertical slots further enable the socket component to be rotated into an open position or a closed position.

\* \* \* \* \*